United States Patent [19]

Suzuki et al.

[11] 4,062,623
[45] Dec. 13, 1977

[54] DEVICE FOR OBSERVING AN OBJECT

[75] Inventors: Akiyoshi Suzuki, Tokyo; Maso Totsuka, Ohmiya, both of Japan

[73] Assignee: Canon Kabushiki Kaisha, Tokyo, Japan

[21] Appl. No.: 672,022

[22] Filed: Mar. 30, 1976

[30] Foreign Application Priority Data

Apr. 7, 1975   Japan .................................. 50-42083

[51] Int. Cl.$^2$ ............................................. G02B 21/06
[52] U.S. Cl. ................................ 350/91; 350/162 SF;
350/175 TS; 350/236; 350/237; 356/120;
356/172; 356/209
[58] Field of Search .................... 350/17, 91, 175 TS,
350/236, 237, 162 SF; 356/120, 129, 172, 209

[56] References Cited

U.S. PATENT DOCUMENTS

| 3,565,568 | 2/1971 | Hock | 356/209 X |
| 3,796,497 | 3/1974 | Mathisen | 356/172 X |

FOREIGN PATENT DOCUMENTS 2,428,594   2/1976   Germany .............................. 356/210

OTHER PUBLICATIONS

Dalton, "Bright Field Reflective Schlieren System" IBM Technical Disclosure Bulletin, vol. 14, No. 1, pp. 66–67, June 1971.

*Primary Examiner*—John K. Corbin
*Assistant Examiner*—Matthew W. Koren
*Attorney, Agent, or Firm*—Fitzpatrick, Cella, Harper & Scinto

[57] ABSTRACT

A device for observing an object such as, for example, a mask, wafer, and so forth to be used in a printer for IC and LSI, and including a flat reflection surface and an inclined reflection surface having a certain inclination with respect to the flat reflection surface, by which light beam reflected at the flat reflection surface is removed by filter means to make it possible to observe only the inclined reflection surface of the object.

6 Claims, 6 Drawing Figures

DEVICE FOR OBSERVING AN OBJECT

BACKGROUND OF THE INVENTION

1. Field of the Invention

This invention relates to a device for observing an object, having a flat reflection surface and an inclined reflection surface having a certain inclination with respect to the flat reflection surface, such as, for example, masks, wafers, etc. to be used in a printer for IC and LSI.

2. Description of the Prior Art

Steps for fabricating semiconductor elements such as transistors and integrated circuit elements (IC, LSI) include printing of fine patterns, bonding of lead wires, and other related works, all of which require highly precise positioning of the wafer or pellet on a predetermined position for printing the patterns thereon. Since the wafers, etc. are in such a micro-structure of the order of a micron or a sub-micron, the precision in positioning such wafers, etc. should be done to that order. However, this kind of work is extremely intricate even to skilled workers, and takes a long period of practice until such high skill is attained.

In the high precision positioning of a micro-structure on a wafer, on which the printing is to be effected, and a fine pattern on the mask, it has so far been the usual practice for an operator observe an object to be positioned through a microscope, and manually displace the object to a predetermined position. In recent years, however, various attempts have been made to perform this kind of positioning operation by an automatically operated positioning machine. The so-called "automatic aligner" is one type of such machine.

In such automatic alignment, i.e., automatic position adjusting method, a photo-electric expedient is used for the positioning. For example, when a separate pattern is to be superposed and printed on a pattern of an actual circuit element which has already been formed on the wafer, an alignment mark previously provided on the wafer and another alignment mark provided on the mask are brought into coincidence, whereby the formed pattern and the separate pattern are brought to a desired relationship. In this alignment technique, when the alignment mark provided on the wafer and the alignment mark provided on the mask are mutually off their predetermined position, such positional discrepancy is detected photoelectrically to cause a servo-mechanism to operate until the discrepancy becomes nil, thereby adjusting the positional discrepancy between the wafer and the mask. It should be noted that an exclusive alignment mark need not always be provided on the wafer, but a part of the actual element pattern formed thereon may be used as the alignment mark for the same result.

In the above-described photoelectric detection for the alignment technique, the image contrast of the object to be observed constitutes a factor to give a decisive influence on the detection precision. A problem inherent in the conventional automatic alignment device resides in its inability to obtain sufficient image contrast, possible causes for which may be as follows.

First of all, setting aside the quality of the optical system per se, a problem arising from the mask and a problem arising from the wafer are the principal causes. That is to say, reflected light from the surface of chromium, which has been conventionally used as the material for the mask, constitutes a component of flare to deteriorate the SN ratio of a signal, and reflected light from the surface of silicon dioxide or photo-resist coated on the silicon substrate functions in the same way. Besides the above, since the silicon dioxide layer or the photo-resist layer possesses the function of an interference thin film, the pattern to be observed may on some occasion give rise to a reversing phenomenon between a bright portion and a dark portion, when the coated layer is in a certain specific film thickness, to constitute a factor adversely affecting treatment of the pattern portions as an electrical signal.

A device which solved such drawback is disclosed in U.S. Pat. No. 3,796,497 issued Mar. 12, 1974. This patented device utilizes a wafer and a mask, wherein an alignment mark is formed by a flat reflection surface and an inclined reflection surface having an inclination with respect to the flat reflection surface, and disposes a telecentric lens (although the specification does not say specifically the use of the telecentric lens) in such a manner that the optical axis thereof may be orthogonal to the flat reflection surface of the wafer and the mask. At the position where the optical axis of the telecentric lens intersects with the pupil surface thereof, there is formed a light source image which is smaller in size than the pupil opening. By the light from this light source image, the wafer and the mask are illuminated through the telecentric lens. The telecentric lens, when a light source is provided at the intersection of the optical axis and the pupil surface, possesses such a property that principal light becomes parallel with the optical axis. On account of this, the principal light of the light beam from the telecentric lens is projected perpendicularly onto the flat surface of the mask and wafer. The light which has been projected perpendicularly onto the flat surface quite naturally travels backward along the incident light path, and again forms the light source image at the abovementioned position of the light source image. On the other hand, since the light from the inclined reflection surface having an inclination with respect to this flat surface travels with a certain inclination with respect to the optical axis of the telecentric lens, no light source image is formed on the abovementioned position of the light source image. On account of this, the reflected light from the flat surface is removed by arranging a light intercepting means of the same size as that of this light source image at the position of the light source image. Therefore, when the surfaces of the mask and wafer are observed from the backside of this light intercepting means, the flat surface cannot be observed, but only the inclined surface can be observed, as the result of which an alignment mark of very high image contrast can be obtained.

In addition to the afore-described construction, this patented device further provides a semi-transparent mirror on the pupil surface of the telecentric lens at an inclined angle to form the light source image thereon, and, at the same time, arranges the abovementioned filter means on this mirror surface. This arrangement, however, possesses various disadvantages. For example, when the pupil surface of the telecentric lens is not so much separated from the telecentric lens, the distance between the telecentric lens and the position of the pupil surface is normally very short, and, in an extreme case, the pupil surface possibly invades into the lens system. In such case, it is almost impossible to provide the mirror within such small space at an inclined angle. Considering this point, therefore, the lens used in this patented device may not be the telecentric lens.

SUMMARY OF THE INVENTION

In view of the foregoing, it is an object of the present invention to provide a device for observing an object, from which the abovementioned drawbacks are removed.

With a view to attaining the object of the present invention, the half mirror is disposed at a position off the pupil surface, and the light filter is disposed at an image position of the pupil.

The foregoing object, other objects, as well as the specific construction and operation of the device according to the present invention will become more apparent from the following detailed description of the invention, when read in connection with the accompanying drawing.

DETAILED DESCRIPTION OF PREFERRED EMBODIMENT

Figure 1:
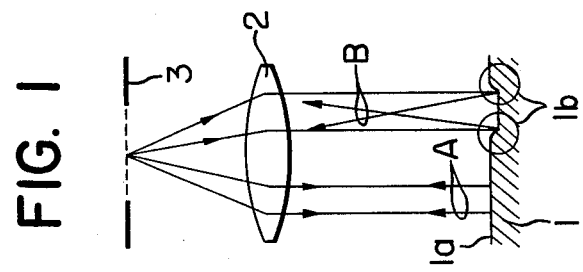
FIG. 1 is a schematic cross-sectional view explaining the optical layout and the optical phenomenon to constitute the fundamental of the present invention.

Referring first to FIG. 1, the optical layout and the phenomenon to be derived therefrom, which are the fundamentals of the embodiment of the present invention, will be explained. In the drawing, a reference numeral 1 designates an object having a flat surface 1a which easily reflects light such as, for example, a wafer. Also, a reference numeral 1b designates an inclined part which constitutes a boundary of an alignment mark formed on a semiconductor body. A numeral 2 refers to a telecentric lens, the optical axis of which is disposed perpendicularly to the flat surface 1a of the object 1. A numeral 3 denotes an aperture provided in alignment with a front focal point of the telecentric lens 2 to constitute an incident pupil for an optical system comprising the lens 2 and the aperture 3. If a light source is to be provided at the intersection of the optical axis and the pupil surface, the principal light corresponding to each picture angle passes through the lens 2, after which it becomes parallel with the optical axis. When such light beam is projected onto the object 1 to be observed, the principal light which is the center of the light beams reflected at the reflective flat surface 1a travels back along the same light path, through which they came, hence the reflected light converges on the position of the pupil, i.e., on the front focal point of the object lens. The light beam, in which the principal light projected onto the object travels back along the same light path, through which it came, will hereinafter be called "the reflected light A." On the other hand, the principal light projected onto the inclined surface 1b of the object diverts its optical axis, which does not coincide with the original light path, hence it never goes back to the original point of light emission. This kind of light beam will hereinafter be called "the reflected light B." By removing this reflected light A and extracting the reflected light B alone, it becomes possible to observe an image on the inclined surface 1b with a high image contrast. The "observation of an image" as used herein means not only the observation through the human eyes, but also reading of the image or reflected light from the inclined surface 1b by means of a light receiving device, an image pick-up tube, and the like.

Figure 2:
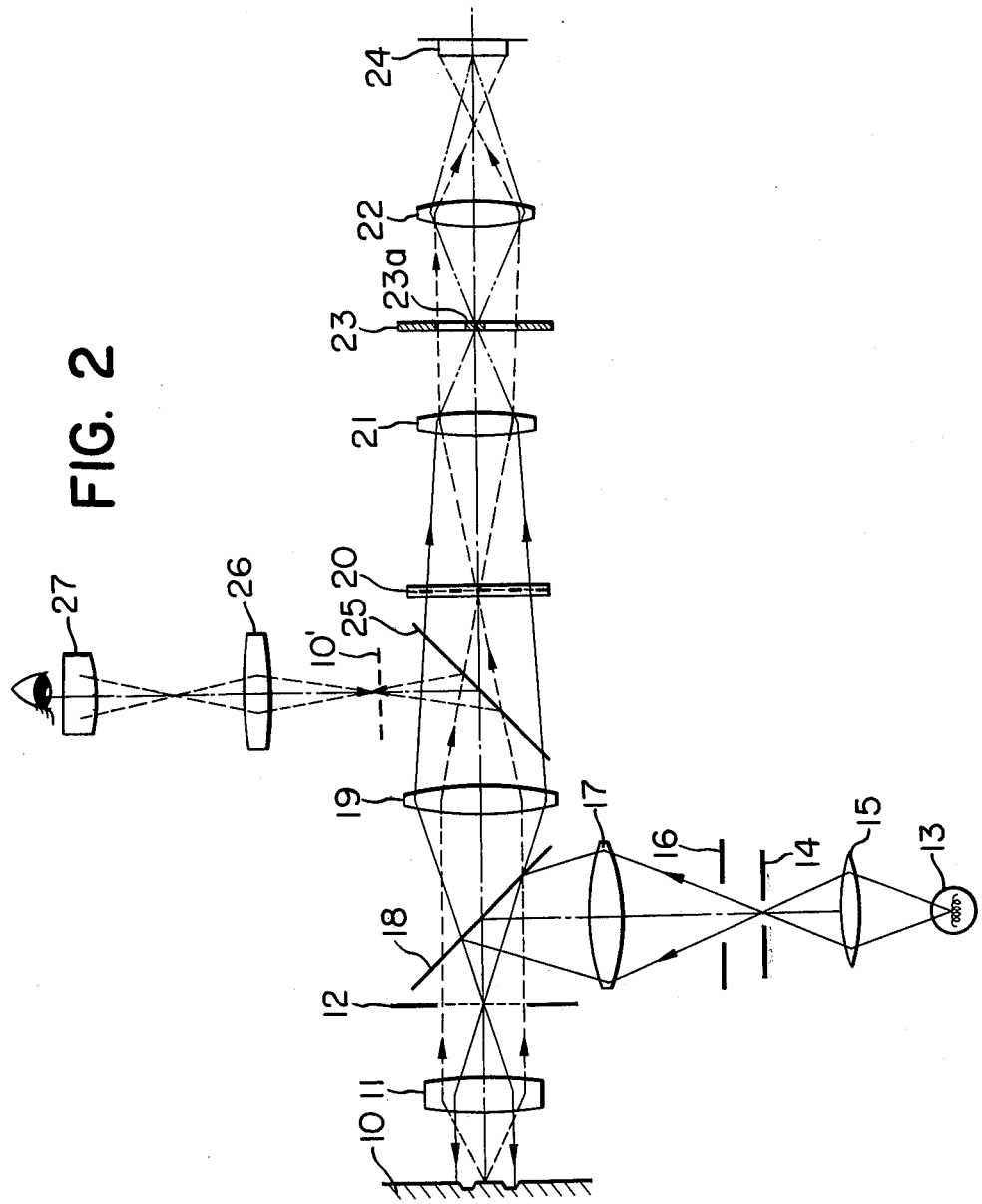
FIG. 2 is a schematic cross-sectional view showing one embodiment of the present invention.

In FIG. 2, a reference numeral 10 designates an object. A reference numeral 11 denotes a telecentric object lens of a microscope, 12 designates an aperture provided in alignment with the focal point of the object lens 11, which also constitutes the position of the pupil of the object lens 11. A numeral 13 refers to a lamp, 14 designates a brightness aperture, and 15 denotes a lens which forms an image of the lamp 13 on the opening of the aperture 14. The brightness aperture 14 determines a size of a secondary light source image to be formed on the pupil 12. A numeral 16 refers to a sight aperture which determines a region of the object 10 to be illuminated. Absence of the sight aperture will cause deterioration in precision of the observation owing to the outside area of the effective sight of the microscope being excessively illuminated, or light scattering taking place outside the effective diameter of the object lens. A reference numeral 17 designates a lens for focussing an image of the lamp 13 on the pupil 12 of the lens 11, and a numeral 18 refers to a semi-transparent mirror. This semi-transparent mirror 18 is for introducing light from the illuminating optical system (13, 14, 15, 16 & 17) provided at the vertical side of the optical axis of the object lens 11 into the light path of this object lens 11. The point to be taken care of is that the light source image is not formed in a manner to cover the entire diameter of the pupil to be determined by the number of openings of the object lenses in a microscope, but that the illumination is carried out by forming the light source in a considerably smaller size than the diameter of the pupil, i.e., coherent illumination or partially coherent illumination is effected. When the diameter of the pupil is taken as R and the diameter of the light source image is taken as $\gamma$, the value of $\gamma/R$ ranges from 0.2, 0.3 to 0.6, 0.7.

A reference numeral 19 designates a relay lens, and 20 refers to a scanner. The scanner 20 is disposed in alignment with the focussing surface of the object 10 due to the object lens 11 and the relay lens 19. The broken lines in the optical layout denote the light path. The scanner 20 has a slit opening, and moves in the direction traversing the optical axis, and causes light from a part of the object 10 to pass therethrough in sequence. This scanner 20 may be of a transmission type or reflection type, by either type of which sampling of photoelectric informations in the arbitrary region on the object can be done. For the detection method, there is, for example, U.S. Pat. No. 3,683,195.

Reference numerals 21 and 22 designate focussing lenses for each of the pupils which function in such a manner that, once the pupil 12 is focussed by the relay lens 19 and the pupil focussing lens 21, it is again focussed by means of the pupil focussing lens 22. Thin solid lines in the optical layout denote the light path. A reference numeral 23 designates a filter, at the center of which there is provided a stopper 23a for removing the reflected light A. The size of this stopper is determined by both the size of the light source focussed on the pupil 12 and the pupil focussing magnification synthesized by the lenses 19 and 21. A numeral 24 refers to a photo-detector which may be any well known means. The position of the photo-detector conjugates with the position of the pupil.

With the afore-described optical layout, the light beam from the partial coherent light source formed on the pupil 12 passes through the object lens 11 of the microscope, after which the principal light becomes parallel with the optical axis and is projected onto the object. Since the lens is telecentric, the light source image due to the reflected light A of the light beam reflected by the reflective object 10 coincides with the original light source image, and the reflected light B arrives at the portion where no reflected image of the light source is formed on the pupil. What is to be detected at the photoelectric detection section is a reflected light coming from the inclined surface of the object, owing to which the effect of the interference thin film at the silicon dioxide layer or the photo-resist layer can be perfectly neglected. When the inclined surface is to be used as the alignment mark, it is preferable that such mark may be of a construction wherein a large number of inclined surface are included.

The reflected lights A and B which have passed through the pupil surface further pass through the relay lens 19 and the pupil focussing lens 21, of which the reflected light A is focussed on the stopper 23a of the filter and light-intercepted. In the meantime, the reflected light B passes through the filter without being filtered, and is received by the photo-detector 24 through the lens 22. The information from the inclined part is transmitted to the photo-detector. In this case, since the reflected light A is removed, an information of sufficiently high contrast can be obtained which conveniently facilitates the electrical treatments after the filtering operation. Also, the portion to be detected by the photo-detector is selected by actuating the scanner in advance.

A reference numeral 25 designates a semi-transparent mirror for leading out the observation light beam, 26 a collector lens, and 27 an eyepiece. An observer can observe an object in its aerial image 10' as a bright sight through the eye-piece 27 and the collector lens 26.

Figure 3:
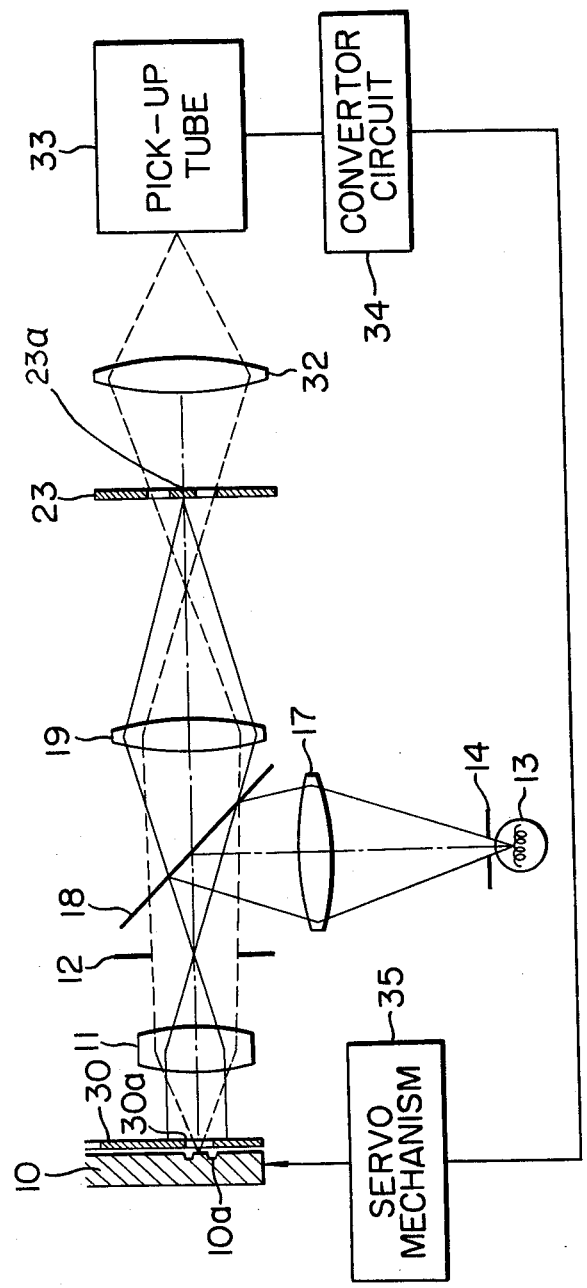
FIG. 3 is also a cross-sectional view showing a modification of the embodiment shown in FIG. 2.

The embodiment shown in FIG. 3 is to electrically treat the information received by an image pick-up tube which is employed in place of the scanner. In this illustrated embodiment, the object 10 is, for example, a wafer coated with a photo-resist. A reference numeral 10a designates an alignment mark, and 30 denotes a mask, wherein an alignment mark 30a is an opening perforated in this mask plate. The mask plate is spaced apart from the wafer for a few tens of microns or so. A numeral 32 refers to a second relay lens, 33 denotes an image pick-up tube, 34 designates an electrical circuit for converting a differential information between the alignment mark on the wafer detected by the image pick-up tube 33 and the alignment mark of the mask into an electrical signal, and 35 refers to a servo-mechanism to be actuated by an output signal from the electrical circuit 34, by which the wafer 10 is moved until the output signal reaches a predetermined condition. The remaining reference numerals in this drawing designate the same or similar component parts as in FIG. 2. The wavelength of the light source should be within a range wherein the photoresist is not sensitized. Also, in this embodiment, the light source to be used is a lamp per se, which is not focussed by any means.

The lens 17 causes the light source 13 to be focussed on the pupil 12 of the object lens 11. In this case, the pupil is on the front focal point of the object lens 11. Also, the light source is focussed on the pupil in a manner to be totally coherent or partially coherent, and the light source image due to reflected light A from the wafer and the mask is removed by the stopper 23a placed on the conjugated surface of the pupil 12. Images on the wafer 10 and the mask 30 are focussed on the light receiving surface of the pick-up tube 33, and electrically treated.

The characteristic of this method resides in that the light before it is intercepted by a filter is of the same quality as the light which has been used in the conventional alignment. Accordingly, when the beam splitter is disposed either before or after the lens 19 and the reflected light which has been split thereby are introduced into the observation system, it becomes possible to see exactly the same image as that which have been observed by the conventional alignment observation system. Sight of the observing system is an ordinary bright sight, and the optical system for the electrical treatment system is able to intercept the reflected light A by the filter and to increase its image contrast.

In place of the pick-up tube 33, C.C.D. or an array of photo-detectors may be provided, and the scanning may be done sequentially from the end of the detector array.

Further, depending on the construction of the alignment mark, the scanning operation is not always necessary, but the positional discrepancy between the wafer and the mask can be detected by the difference in the amount of light received by each of a plurality of the photo-detectors.

Figure 4:
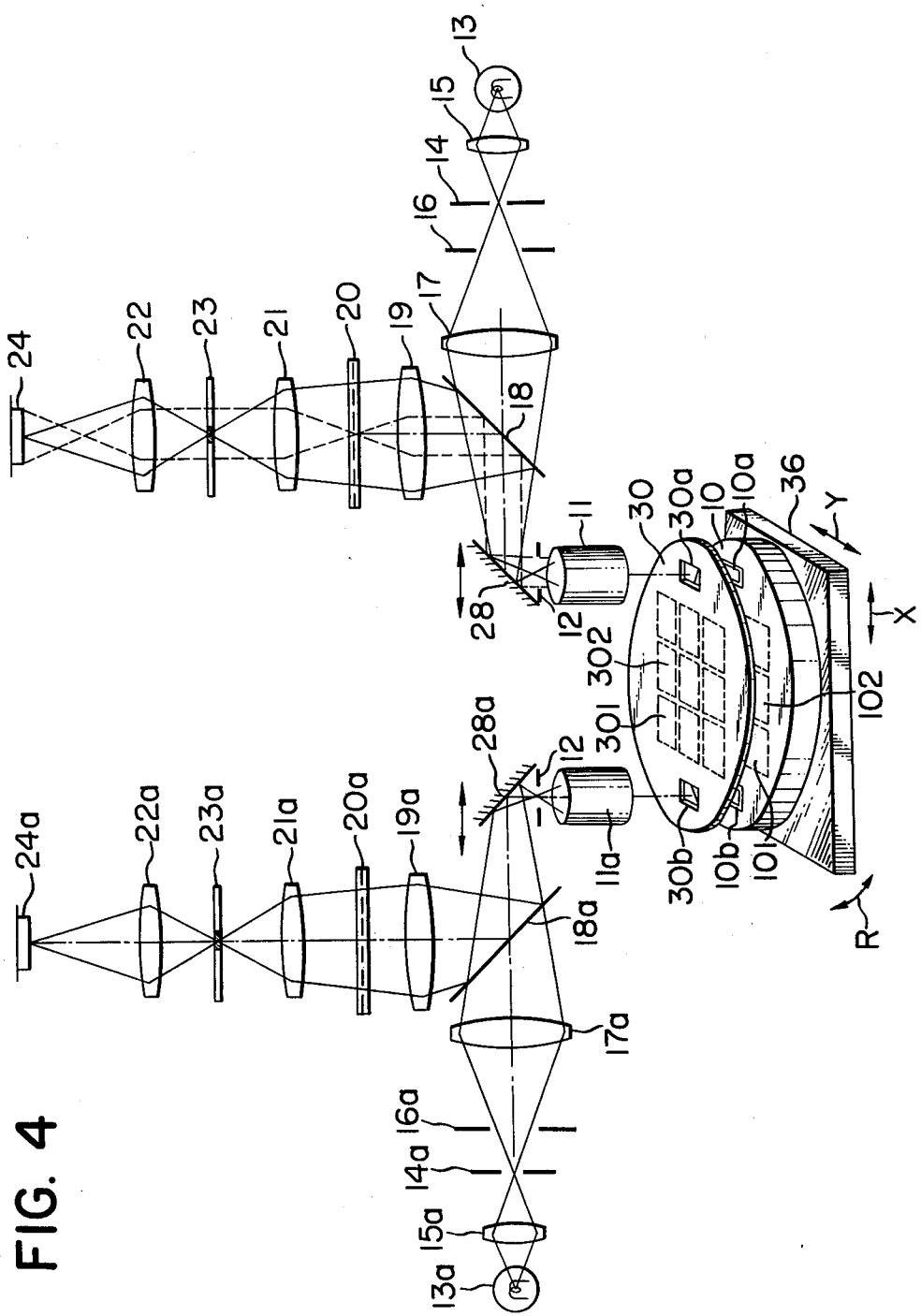
FIG. 4 is a perspective view, partly including a cross-section thereof, of the embodiment of FIG. 2 when used as the aligner for a mask printing device.

FIG. 4 indicates an alignment device, wherein the embodiment of FIG. 2 is utilized. In most cases, the alignment mark is provided in a plurality of numbers on the wafer so as to assure accuracy in the alignment. At least two alignment marks are required for restraining two freedoms in the parallel direction and one freedom in the rotational direction.

In the drawing, a reference numeral 10 designates a semiconductor wafer, 10a and 10b refer to the alignment mark. A numeral 30 denotes a mask, and 30a and 30b respectively represent alignment marks. A numeral 36 refers to a parallel movable stand for fixing and shifting the wafer 10, which is capable of linear movements in the directions of X and Y, and rotational movement R. Numerals 101, 102, ... represent real circuit elements which have already been printed on the wafer 10, and numerals 301, 302, ... are respectively real circuit element patterns formed on the mask 30, and to be printed onto the wafer.

The system composed of members designated by reference numerals 11 through 28 inclusive is exactly same as the construction already explained with reference to FIG. 2. In this embodiment, another unit of such system as that composed of members designated by reference numerals 11a through 28a inclusive is provided. The total reflection mirror 28 is provided to divert the direction of the optical axis. Further, in this apparatus, the object lens 11 or 11a, the aperture 12 or 12a, and the total reflection mirror 28 or 28a are integral and are capable of performing parallel movement. They can be made near to and away from the semitransparent mirror 18 in accordance with the position of the alignment mark or a size of the wafer. However, when the object lenses 11 and 11a are moved for adjusting their positions, the light source (a pin-hole of the aperture 14)

and the incident pupil (the aperture 12) do not necessarily satisfy the conjugation relationship. Such discrepancy can be adjusted by moving the position of the lens 19 in a very small quantity. In practice, if the F-number of the image focussing optical system extending from the light source to the incident pupil is made large, there will take place no inconvenience, even if the lens 19 is not moved.

Further, the incident pupil (the aperture 12) and the filter 23 are mutually conjugated through the lens 19 and the lens 21. In this case, too, accurate conjugation relationship may not necessarily be realized even by the movement of the object lens.

In such a case, however, if the focussing magnification from the incident pupil to the filter is made small, no practical problem arises as regards break down of the conjugation relationship, and the size of the stopper on the filter can be determined in advance taking into consideration the positional discrepancy. The adjustment of the conjugation relationship can also be done by movement of the lens 21.

The mask aligner which adopts this type of layout can be applied to a device, wherein the pattern printing is carried out in a state of the mask and the wafer being contacted, or to a device, wherein the pattern printing is carried out in a state of the mask and the wafer being spaced for a very slight distance of, say, a few tens of microns or so. As is well known, the illumination device is arranged above the mask, although FIG. 4 does not show the illumination device for printing.

The aligners comprising the component parts designated by reference numerals 11 through 28 inclusive, and 11a through 28a inclusive are removed from the light path at the time of the printing, and they are moved to such a position as indicated in the drawing at the time of the alignment. An ordinary printing device is of such a construction that the mask is fixed on the main body of the printing device, and the positioning is done by moving the wafer, hence explanations will be made hereinbelow in reference to this construction.

First, the symmetrical object lenses 11 and 11a are so positioned that they may come to the positions where the alignments marks 30a and 30b can be viewed therethrough. Illuminating light from the light sources 13 and 13a illuminates the surfaces of the apertures 12 and 12a in a partially coherent manner, and then, through the object lenses 11 and 11a, illuminates the alignment marks 10a and 10b of the wafer in a manner to include also the alignment marks 30a and 30b of the mask in the illumination,. Upon such illumination being effected, the reflected light A which is the principal light of the illuminating light beam perpendicularly reflected at the surrounding surface of the alignment mark as well as the surface of the alignment mark per se, and the detected reflection light are intercepted by the filters 23 and 23a, or received by the photo-detectors 24 and 24a, taking the behavior as explained with reference to FIG. 2. The servo-mechanism (not shown in the drawing figure) is actuated by an information which represents positional difference between the wafer and mask which have received the light, whereby the parallel movable stand 36 linearly and parallelly moves in both X and Y directions as well as rotates in the direction of R so that the position of the wafer may be displaced until the predetermined conditions are satisfied.

It is of course possible that the object may be observed directly through eyes by interposing a semi-transparent mirror between the lenses 19 and 19a and the scanners 20 and 20a to thereby lead out the light beam, as shown in FIG. 2.

The filtering optical system can be modified in various other ways than those shown in FIGS. 2 and 3. Further, in the optical layout shown in FIG. 2, the scanning operation can be done subsequent to the filtering operation. The type of the scanner can also be classified into two major groups of a transmission type, wherein the scanning is performed by transmitting light in accordance with the time sequence of the scanning space which receives the light beam from the object to be observed, and a reflection type, wherein the scanning is performed by taking out light in a different direction through reflection. Even in the scanner of the transmission type, there are various constructions, wherein the scanning is done by simply moving a slit, or by a fiber train, or by rotation of a prism, and by other means.

However, the most important point in this embodiment is that the light source image on the pupil is intercepted by the filter by illuminating the pupil surface either in a coherent manner or a partially coherent manner. Also, since the bright sight observation system can be used, this embodiment is usable as the aligner for the manual adjustment, which is one of its advantages.

Figures 5, 6:
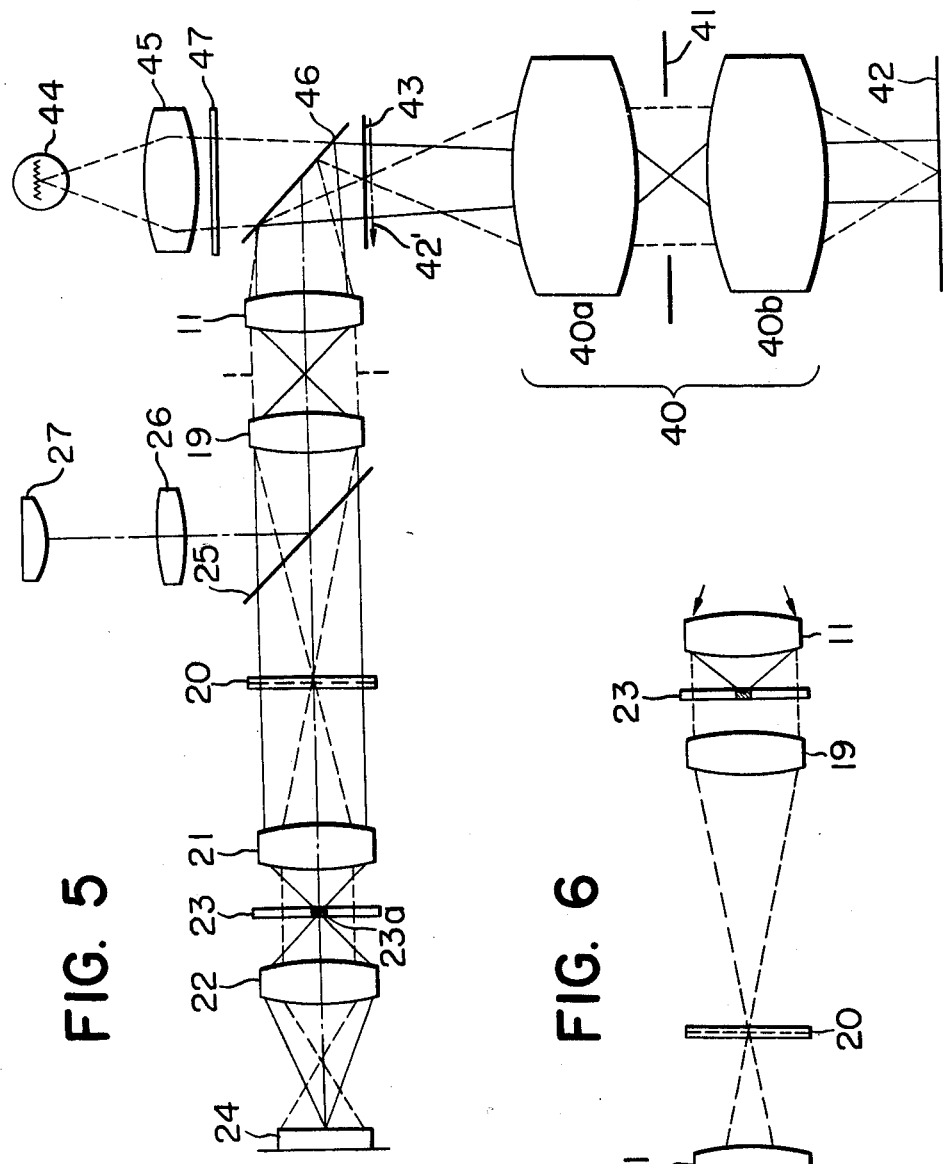
FIG. 5 is a cross-sectional view of another embodiment of the present invention.
FIG. 6 is a partial cross-sectional view of the embodiment of FIG. 5 where modification is effected.

FIG. 5 shows an embodiment, wherein the present invention is applied to a printing device of a type which projects an image of the mask onto a photosensitive layer through a projection optical system. In this illustrated embodiment, a reference numeral 40 designates a projection lens (for the sake of convenience in explanation, this projection lens is divided into a front group 40a and a telecentric rear group 40b). A numeral 41 refers to a pupil position in this optical system, 42 denotes a photosensitive surface of the wafer, and 43 represents a photo-mask. The photosensitive surface 42 and the mask 43 are conjugated with respect to the projection lens 40. A numeral 44 designates a light source, and 45 denotes a condenser lens which forms the light source image on the pupil 41. In this case, a ratio between the size of the light source image and the size of the pupil should most preferably be from 0.1 to 0.4 or so, which contitutes the partially coherent illumination as already mentioned in the foregoing. A reference numeral 46 denotes a beam splitter which is integral with the detection and observation optical systems constructed with the component parts designated by reference numerals 11 through 27 inclusive, and which is inserted in the light path between the mask 43 and the condenser lens 45 at the time of the alignment. A numeral 47 represents a filter which intercepts a light component of a light beam from the light source 44 having a wavelength of a region, within which the photosensitive layer is sensitized.

In the following, operation of this embodiment will be explained. Light emitted from the light source 44 is focussed on the pupil 41, the main light of which becomes parallel with the optical axis through the rear group 40b of the projection lens to be projected onto the photosensitive surface 42. The photosensitive surface 42 has already formed thereon a micro-structure by printing and treatment, over which a photosensitive material is coated. Light reflected at this photosensitive surface is superposed on the mask 43 which is conjugative with the photosensitive surface 42, and focussed thereon as an image 42'.

In this optical layout, the image 42' on the wafer surface and the mask 43 corresponds to the object to be observed with respect to the object lens 11, and the principal light (shown in thin lines) from the mask 43 and the photosensitive surface 42 is focussed at the backside of the object lens 11. This corresponds to the abovementioned reflected light A.

Although the filtration may be done at this position, the erector 26 and the eye-piece 27 for the observation system are disposed behind the beam splitter 25 for introducing light into this observation system, since both of them are at the backside of this position. When the image observation is performed subsequent to the filtration, a dark sight will be viewed.

On the other hand, the relay lens 19 and the object lens 11 focus the image 42' of the mask 43 and the wafer 42 on the scanner 20. This scanner 20 then scans the image 42' of the mask 43 and the wafer. When the scanned light beam is projected into the pupil focussing lens 21, the reflected light A is converged into a region where the stopper 23a intercepts light.

Accordingly, the light beam, which has been scanned, and from which the reflected light A has been removed, is projected into the lens 22, and subsequently, the photo-detector 24 receives the light. The photo-detector 24 detects the positional discrepancy between the mask 43 and the wafer 42 by receiving the variation in light quantity synchronized with the scanning of the scanner 20, or an invariable light quantity.

FIG. 6 is a cross-sectional view of a part of the optical arrangement, wherein the filter 23 is disposed right after the object lens 11. This is an example of the optical layout, wherein the reflected light A is removed prior to scanning by the scanner of the image of the object to be observed.

What is claimed is:

1. A device for photo-electrically scanning and observing an object having a flat reflection surface and an inclined surface with a certain inclination with respect to the flat reflection surface, comprising:
   a. a telecentric system including a telecentric lens, the optical axis of which is perpendicular to the flat reflection surface of said object and a clear aperture of predetermined size located on the focal plane of said telecentric lens;
   b. first transmissive and reflective optical means disposed in a manner traversing the optical axis of the telecentric lens;
   c. an illuminating optical system for forming a light source image on said focal plane smaller in size than said clear aperture through said first transmissive and reflective optical means;
   d. image focussing means disposed coaxial with the optical axis of the telecentric lens for imaging said focal plane and said object;
   e. means for scanning the image of said object, said means being disposed on the image plane of said object;
   f. optical filter means disposed at the position of the image of said focal plane for intercepting light from the flat reflective surface of said object, and for directing the light from the inclined reflection surface to photo-electric detecting means; and
   g. second transmissive and reflective optical means interposed between said focal plane of said telecentric lens and the optical filter means for directing a part of the light coming from the telecentric lens to an observation optical means.

2. The device as claimed in claim 1, wherein said optical filter means consists of a transmissive portion and a non-transmissive portion, said non-transmissive portion having a size sufficient to cover the light source image formed at said optical filter means has been substituted.

3. The device as claimed in claim 1, wherein a ratio between the diameter of said clear aperture and the diameter of the light source image formed on said focal plane by said illuminating optical system ranges from 1:0.2 to 1:0.7.

4. A device for photoelectrically positioning a plurality of objects which comprises:
   a. a telecentric system including a telecentric lens, the optical axis of which is perpendicular to the flat reflection surfaces of said plurality of objects and a clear aperture of predetermined size located on the focal plane of said telecentric lens;
   b. first reflective and transmissive means disposed in a manner traversing the optical axis of said telecentric lens;
   c. an illuminating optical system for forming a light source image on said focal plane of a size smaller than that of said clear aperture through said first reflective and transmissive means;
   d. image focussing means disposed coaxial with the optical axis of the telecentric lens for imaging said focal plane and said plurality of objects;
   e. means for scanning said objects, said means being disposed on the image planes of said objects;
   f. optical means disposed at the position of the image of said focal plane for intercepting light from the flat reflective surface of said plurality of objects and to direct light from the inclined portion to photoelectric detecting means;
   g. second reflective and transmissive means interposed between said optical filter means and said focal plane to direct a part of the light from said telecentric lens to an optical system for observation; and
   h. drive means to cause the relative position of said plurality of objects to change in accordance with signals obtained by said photoelectric detecting means.

5. The device as claimed in claim 4, wherein said optical filter means consists of a transmissive portion and a non-transmissive portion, said non-transmissive portion having a size sufficient to cover the light source image formed at said optical filter means.

6. The device as claimed in claim 4, wherein a ratio between the diameter of said clear aperture and the diameter of the light source image formed on said focal plane by said illuminating optical system ranges from 1:0.2 to 1:0.7.

* * * * *

UNITED STATES PATENT AND TRADEMARK OFFICE
CERTIFICATE OF CORRECTION

PATENT NO. : 4,062,623
DATED : December 13, 1977
INVENTOR(S) : AKIYOSHI SUZUKI, et al.

It is certified that error appears in the above-identified patent and that said Letters Patent are hereby corrected as shown below:

Column 10, lines 10 and 11, delete "has been substituted"; line 36, after "optical" insert -- filter --.

Signed and Sealed this

Twenty-fifth Day of April 1978

[SEAL]

Attest:

RUTH C. MASON
Attesting Officer

LUTRELLE F. PARKER
Acting Commissioner of Patents and Trademarks